(12) United States Patent
Lu et al.

(10) Patent No.: US 9,117,882 B2
(45) Date of Patent: Aug. 25, 2015

(54) NON-HIERARCHICAL METAL LAYERS FOR INTEGRATED CIRCUITS

(75) Inventors: Lee-Chung Lu, Taipei (TW); Yuan-Te Hou, Hsin-Chu (TW); Shyue-Shyh Lin, Zhubei (TW); Li-Chun Tien, Tainan (TW); Dian-Hau Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 172 days.

(21) Appl. No.: 13/158,175

(22) Filed: Jun. 10, 2011

(65) Prior Publication Data

US 2012/0313256 A1    Dec. 13, 2012

(51) Int. Cl.
- *H01L 23/528* (2006.01)
- *H01L 21/768* (2006.01)
- *H01L 21/311* (2006.01)

(52) U.S. Cl.
CPC ...... *H01L 21/7681* (2013.01); *H01L 21/31144* (2013.01); *H01L 21/76816* (2013.01); *H01L 23/5283* (2013.01); *H01L 23/528* (2013.01); *H01L 2924/0002* (2013.01)

(58) Field of Classification Search
CPC .......................... H01L 23/528; H01L 23/5283
USPC ........................................................ 257/758
See application file for complete search history.

(56) References Cited

U.S. PATENT DOCUMENTS

| | | | |
|---|---|---|---|
| 5,616,959 A * | 4/1997 | Jeng .............................. | 257/758 |
| 6,197,688 B1 | 3/2001 | Simpson | |
| 6,362,527 B1 * | 3/2002 | Mehta ........................... | 257/758 |
| 6,458,705 B1 * | 10/2002 | Hung et al. .................... | 438/692 |
| 2001/0017418 A1 * | 8/2001 | Noguchi et al. ............... | 257/758 |
| 2002/0036354 A1 * | 3/2002 | Yamaguchi et al. ........... | 257/775 |
| 2003/0094696 A1 * | 5/2003 | Dunham et al. ............... | 257/758 |

FOREIGN PATENT DOCUMENTS

CN          1124647 C       10/2003

* cited by examiner

*Primary Examiner* — Colleen A Matthews
*Assistant Examiner* — William Harriston
(74) *Attorney, Agent, or Firm* — Slater & Matsil, L.L.P.

(57) ABSTRACT

An integrated circuit structure includes a semiconductor substrate, and a first metal layer over the semiconductor substrate. The first metal layer has a first minimum pitch. A second metal layer is over the first metal layer. The second metal layer has a second minimum pitch smaller than the first minimum pitch.

20 Claims, 10 Drawing Sheets

NON-HIERARCHICAL METAL LAYERS FOR INTEGRATED CIRCUITS

BACKGROUND

Integrated circuit devices such as transistors are typically formed on the surfaces of semiconductor substrates. Metal layers are formed over the integrated circuit devices, and are used to interconnect the integrated circuit devices as functional circuits. There may be as many as ten metal layers formed over a semiconductor substrate.

Since the resistance of a metal line is related to its size, and a lower resistance leads to better performance of the respective integrated circuits, it is preferred that the metal lines are thick, wide, and short in order to have a small resistance. However, the requirement of forming thick and wide metal lines conflicts with the requirement of reducing chip area usage. Accordingly, metal layers typically adopt hierarchical structures, wherein upper metal layers have the thicknesses and widths equal to or greater than the thicknesses and widths, respectively, of lower metal layers. This is because the lower metal layers have more metal lines, and hence have to be narrow to incorporate the large amount of metal lines. The upper metal layers are relatively small in number, and can be larger in size.

When the integrated circuit manufacturing process advances to 20 nm technology or smaller, the pitch of the metal lines, particularly in the lower metal layers, are close to the wavelength of the yellow light, wherein the yellow light is used for exposing photoresists that are used for defining the patterns of metal layer. Special techniques need to be used to reduce or eliminate the problem caused by the small pitch of the metal lines. For example, two photoresists and two etching processes may be needed for defining the pattern of one metal layer. This, however, results in the increase in the manufacturing cost and the reduction in the yield.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

An interconnect structure of an integrated circuit and method of forming the same are provided in accordance with an embodiment. The intermediate stages of manufacturing various embodiments are illustrated. The variations of the embodiments are discussed. Throughout the various views and illustrative embodiments, like reference numbers are used to designate like elements.

Figure 1:
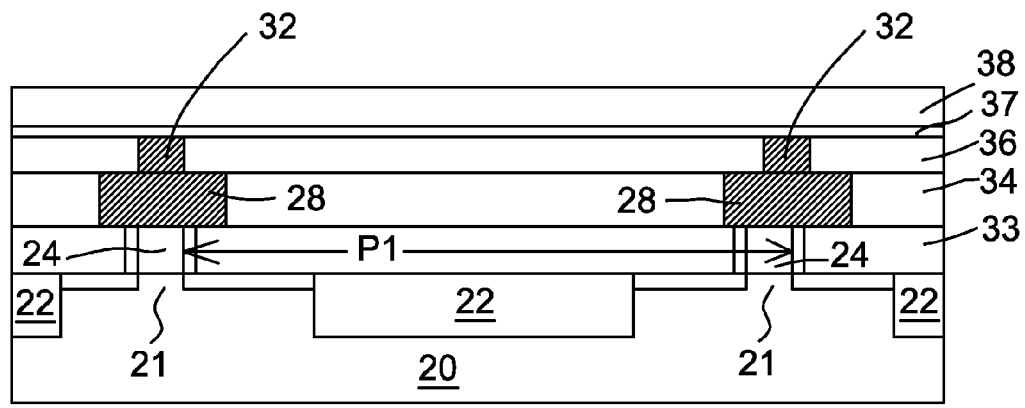
FIGS. 1 through 13 are cross-sectional views of intermediate stages in the manufacturing of an interconnect structure having a non-hierarchical structure in accordance with various embodiment.

FIGS. 1 through 13 are cross-sectional views of intermediate stages in the manufacturing of an interconnect structure in accordance with an embodiment. Referring to FIG. 1, a structure including substrate 20 and overlying devices are provided. Substrate 20 may be formed of a commonly used semiconductor material such as silicon, silicon germanium, or the like, and may be a bulk substrate or a semiconductor-on-insulator (SOI) substrate. Integrated circuit devices such as transistors 21 are formed at a surface of substrate 20. Gate electrodes 24 are formed over substrate 20. Gate electrodes 24 may include active gate electrodes, which form the gates of transistors 21, and possibly dummy gate electrodes (not shown), which are electrically floating. The materials of gate electrodes 24 include metals or metal alloys, polysilicon, or the like. In an embodiment, dummy gate electrodes 24 may be formed over insulation regions such shallow trench isolation (STI) regions 22.

The integrated circuit structure may include metal lines 28 in metal layer M0 (referred to as M0 hereinafter). M0 metal lines 28 are formed over, and may contact, gate electrodes 24. Furthermore, M0 vias 32 are formed over and contact M0 metal lines 28. Gate electrodes 24, M0 metal lines 28, and M0 vias 32 are formed in inter-layer dielectrics (ILDs) 33, 34, and 36, respectively. In the illustrated embodiment, M0 vias 32 are formed using a single-damascene process. In alternative embodiments, M0 vias 32 may be formed along with the overlying metal lines 48 (not shown in FIG. 1, please refer to FIG. 4) in the bottom metal layer (M1) using a dual-damascene process. Accordingly, the dual damascene process steps may be similar to what are shown in FIGS. 10 through 13. Etch stop layer (ESL) 37 may optionally be formed over ILD 36. Inter-metal Dielectric (IMD) 38 is formed over ESL 37. In an embodiment, IMD 38 is formed using a low-k dielectric material having a low-k value, which may be smaller than about 3.0, or smaller than about 2.5.

Gate electrodes 24 have pitch P1, which is referred to as minimum gate electrode pitch P1 hereinafter. It is noted that neighboring gate electrodes 24 on the same chip or wafer may have pitches equal to or greater than minimum gate electrode pitch P1, but cannot have pitches smaller than minimum gate electrode pitch P1. Similarly, the term "minimum pitch" is also used throughout the description to indicate the smallest pitch of the metal lines in other metal layers such as layers M0 through Mtop. In an exemplary embodiment, minimum gate electrode pitch P1 is between about 80 nm and about 100 nm, for example, although different pitches may be used.

Figure 2:
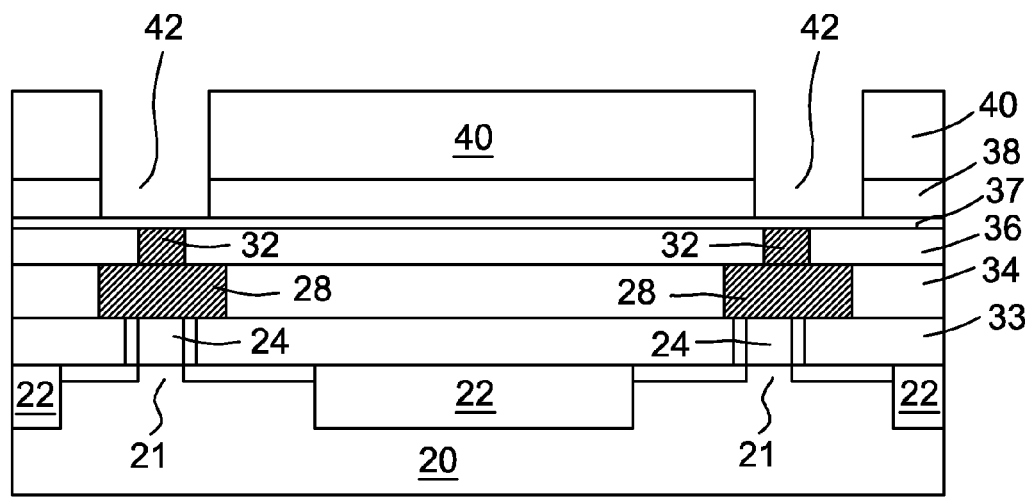
Figure 3:
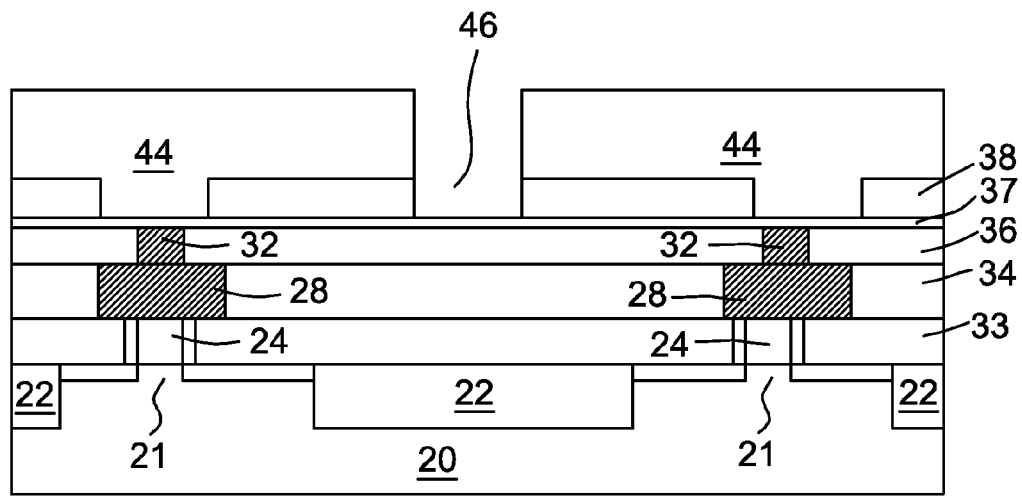
Figure 4:
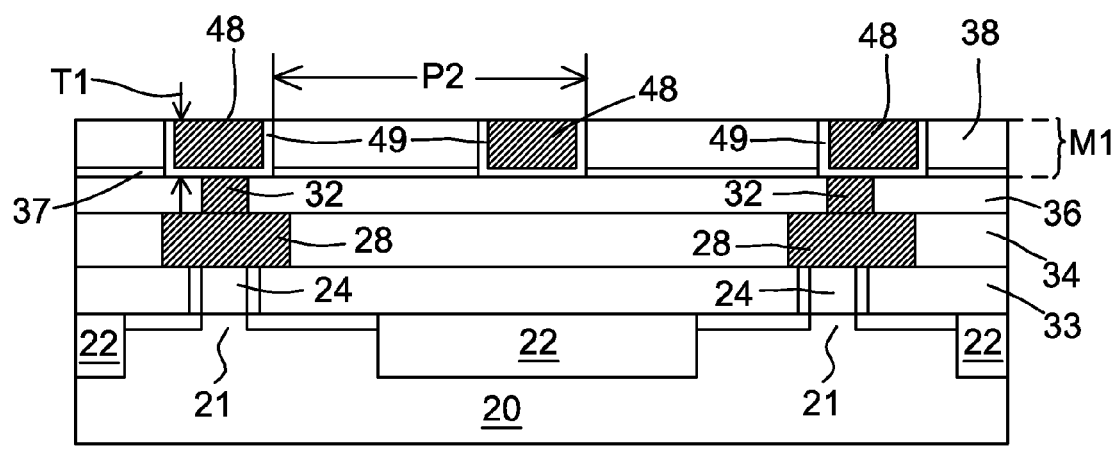

FIGS. 2 through 4 illustrate a two-patterning-two-etching (2P2E) process for forming bottom metal layer M1, which comprises IMD 38, and metal lines in IMD 38. Referring to FIG. 2, photoresist 40 is formed over IMD 38 using a first lithography mask (not shown), and is patterned to form openings 42. IMD 38 is then etched using the patterned IMD 38 as a mask, so that openings 42 extend down into IMD 38. Next, in FIG. 3, photoresist 40 is removed, and photoresist 44 is formed and patterned, forming opening(s) 46. The patterning of photoresist 44 is performed using a second lithography mask different from the first lithography mask, and the first and the second lithography masks belong to a same double-patterning mask set. Photoresist 44 is then removed.

FIG. 4 illustrates the formation of metal lines 48. The formation process may include blanket forming a diffusion barrier layer, which may comprise titanium, titanium nitride, tantalum, tantalum nitride, or the like. The diffusion barrier layer is formed in openings 42 and 46 in IMD 38, and over IMD 38. Next, a metallic material such as a pure (or substantially pure) copper or a copper alloy is filled into openings 42 (FIG. 2) and opening 46 (FIG. 3). A chemical mechanical polish (CMP) is then performed to remove excess metallic material, and leaving metal lines 48 and diffusion barrier layers 49. The formation of metal layer M1 is thus finished.

Metal lines 48 have minimum pitch P2, which is referred to as minimum M1 pitch P2 hereinafter. Minimum M1 pitch P2 may be smaller than minimum gate electrode pitch P1. In an exemplary embodiment, minimum M1 pitch P2 is between about 40 nm and about 80 nm, and may be about 64 nm, for example, although different pitches may be used. Thickness T1 of metal layer M1 may be between about 550 Å and about 750 Å, and may be about 650 Å in an embodiment. It is observed that in FIGS. 2 through 3, in the defining of the patterns of metal lines 48, two photoresists 40 and 44 are used, and two respective patterning steps are performed on photoresists 40/44 and IMD 38. Accordingly, the formation process of metal lines 48 (or the respective openings 42) is referred to as a 2P2E process.

Figure 5:
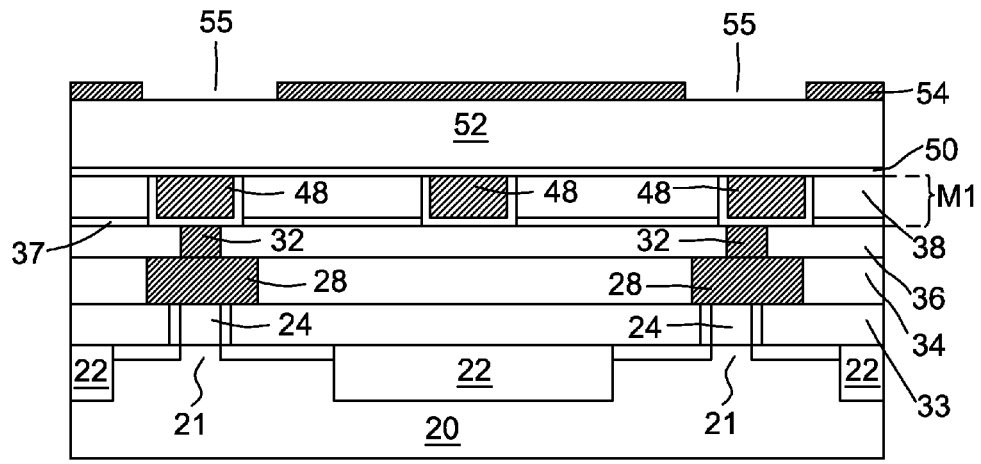

FIGS. 5 through 9 illustrate the formation of metal layer M2 (which is the metal layer immediately over bottom metal layer M1) and the formation of underlying vias. Referring to FIG. 5, ESL 50 is formed, followed by the formation of IMD 52, which may be a low-k dielectric layer. Hard mask 54 is formed and patterned. Hard mask 54 may be formed of silicon nitride, silicon oxynitride, titanium nitride, tantalum nitride, or the like. Hard mask 54 includes openings 55 that define the patterns of metal lines in metal layer M2.

Figure 6:
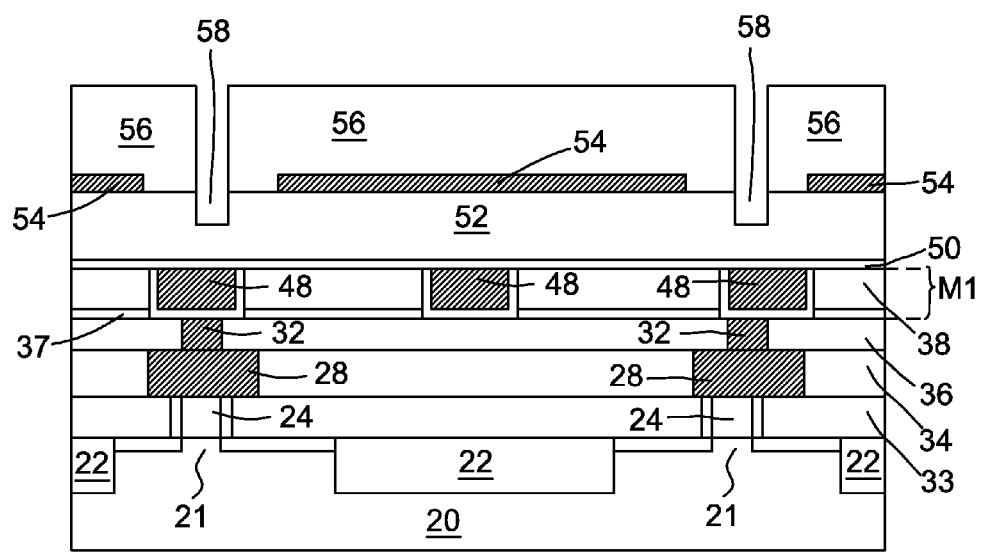

In an embodiment, as shown in FIG. 6, photoresist 56 is formed and patterned to define the patterns of vias. In an embodiment, photoresist 56 is formed of a single layer. In alternative embodiments, photoresist 56 is formed of a composite layer, which may comprise a bottom layer formed of a polar material such as a polymer with hydroxyl or phenol groups, and a middle layer over the bottom layer, wherein the middle layer may be formed of an oxide-like photoresist.

Figure 7:
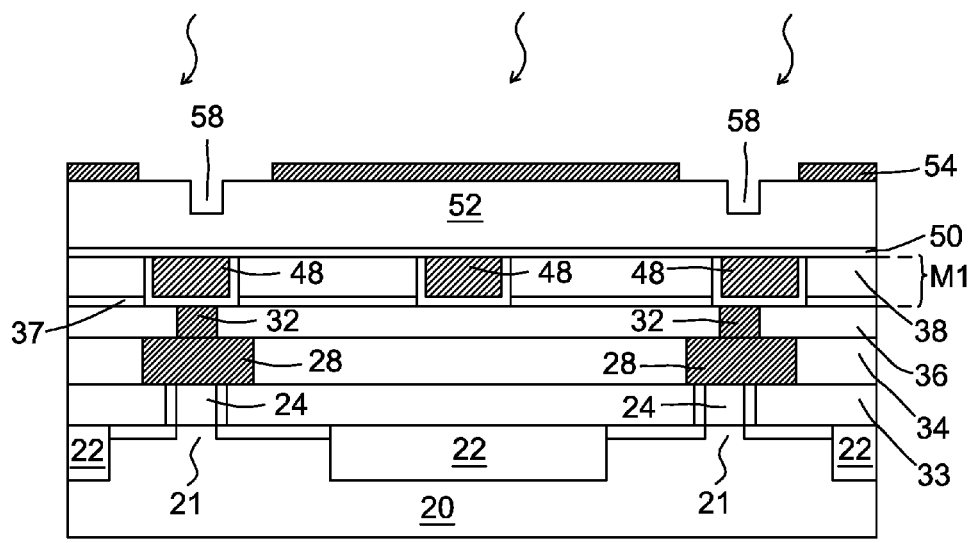
Figure 8:
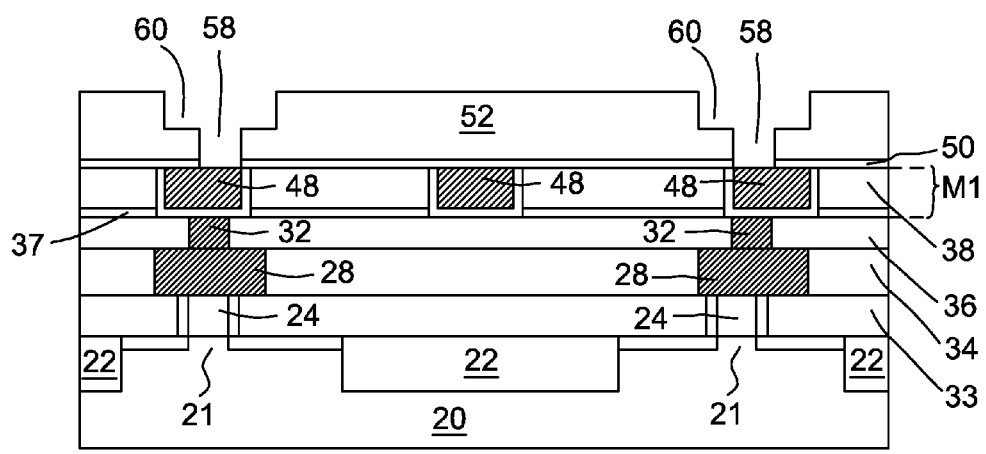

Photoresist 56 is then used to etch into IMD 52 to form openings 58. Openings 58 extend partially into IMD 52, and the bottoms of openings 58 are at an intermediate level of IMD 52. Next, as shown in FIG. 7, photoresist 56 is removed. Hard mask 54 is then used to etch into IMD 52, for example, using an anisotropic etching method. The resulting structure is shown in FIG. 8. During the etching step, via openings 58 extend down so that ESL 50 is exposed. Furthermore, trench openings 60 are formed and stop at an intermediate level of IMD 52. The exposed portions of ESL 50 are also etched, and the underlying metal lines 48 are exposed. Hard mask 54 is also removed.

Figure 9:
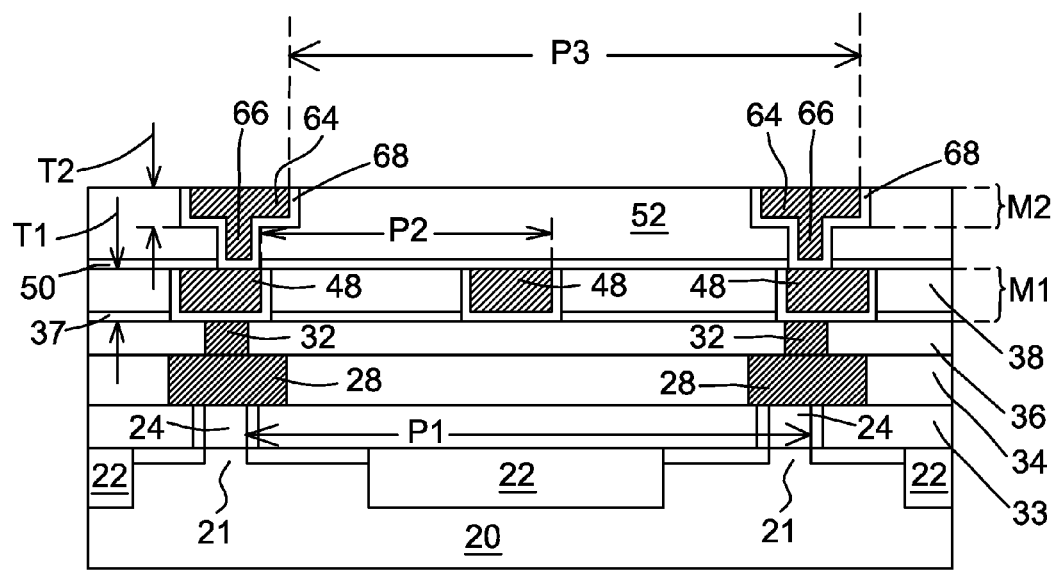

FIG. 9 illustrates the formation of metal lines 64 and vias 66. The formation process may include blanket forming conductive diffusion barrier layer 68, and filling a metallic material such as substantially pure copper or a copper alloy into openings 58 and 60. After a CMP process to remove excess metallic material, metal lines 64 and vias 66 are formed. Throughout the description, metal lines 64 and the part of IMD 52 that is at the same level as metal lines 64 in combination are referred to as metal layer M2.

It is observed that in the formation of metal layer M2 and the underlying vias 66, a single photoresist 56 (FIG. 6) is used, and one patterning step is performed using photoresist 56 (FIG. 6). Accordingly, the formation process of metal layer M2 is referred to as a 1P1E process. The minimum M2 pitch P3 in metal layer M2 may be between about 80 nm and about 100 nm in an exemplary embodiment. Such a minimum pitch makes the using of 1P1E process possible. Furthermore, minimum M2 pitch P3 may be the same (or substantially the same) as minimum gate electrode pitch P1. In an embodiment, metal lines 64 as in FIG. 9 are used for the connections of gate electrodes 24, and hence metal lines 64 may be aligned to gate electrodes 24. Therefore, even though minimum M2 pitch P3 is greater than minimum M1 pitch P2, and is as great as minimum gate electrode pitch P1, there is no chip area penalty incurred. Thickness T2 of metal layer M2 may be between about 800 Å and about 1200 Å, and may be greater than thickness T1. In an exemplary embodiment, thickness T2 is between about 120 percent T1 and about 150 percent T1.

Figure 10:
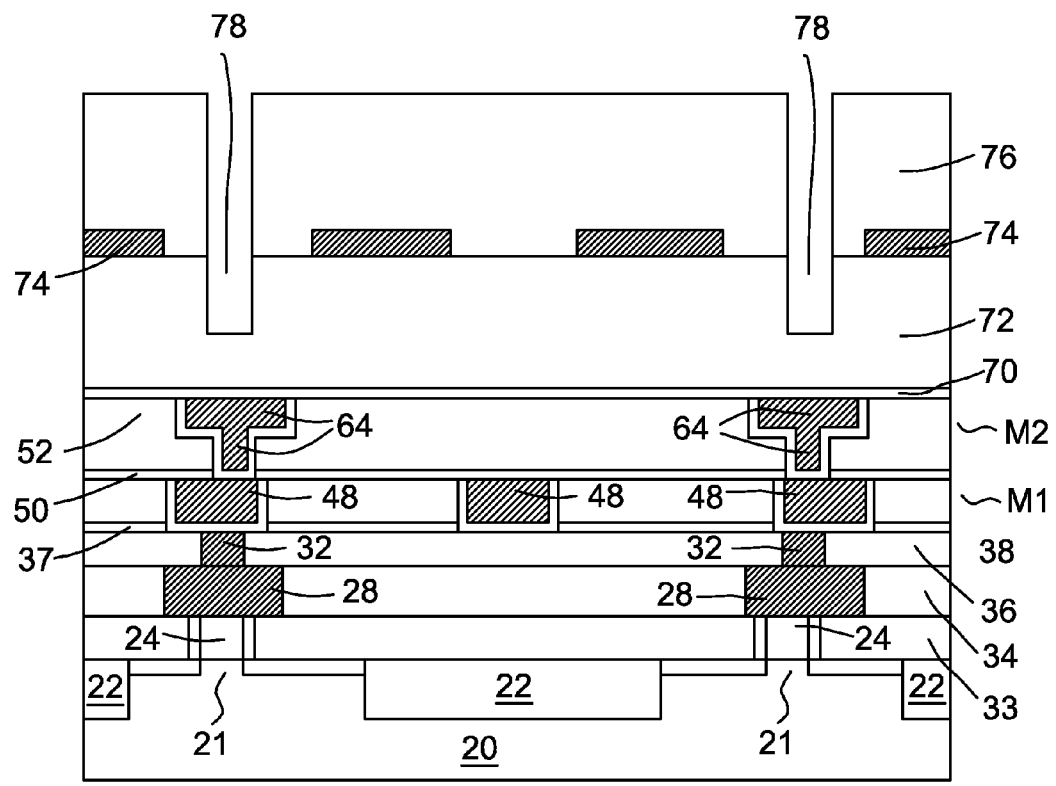
Figure 11:
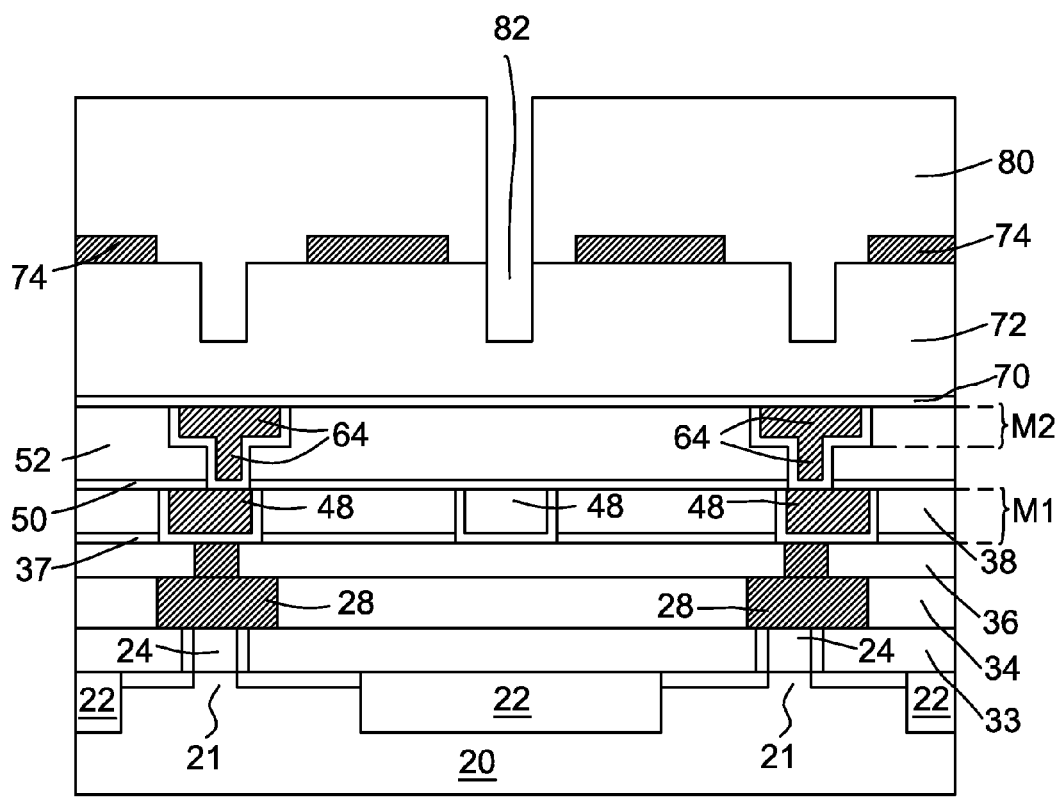
Figure 12:
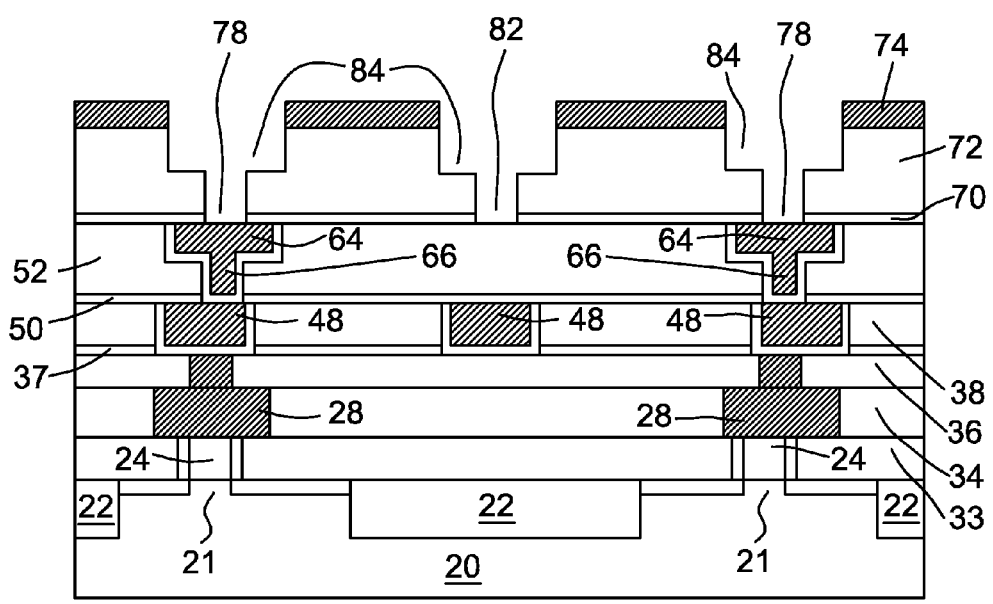
Figure 13:
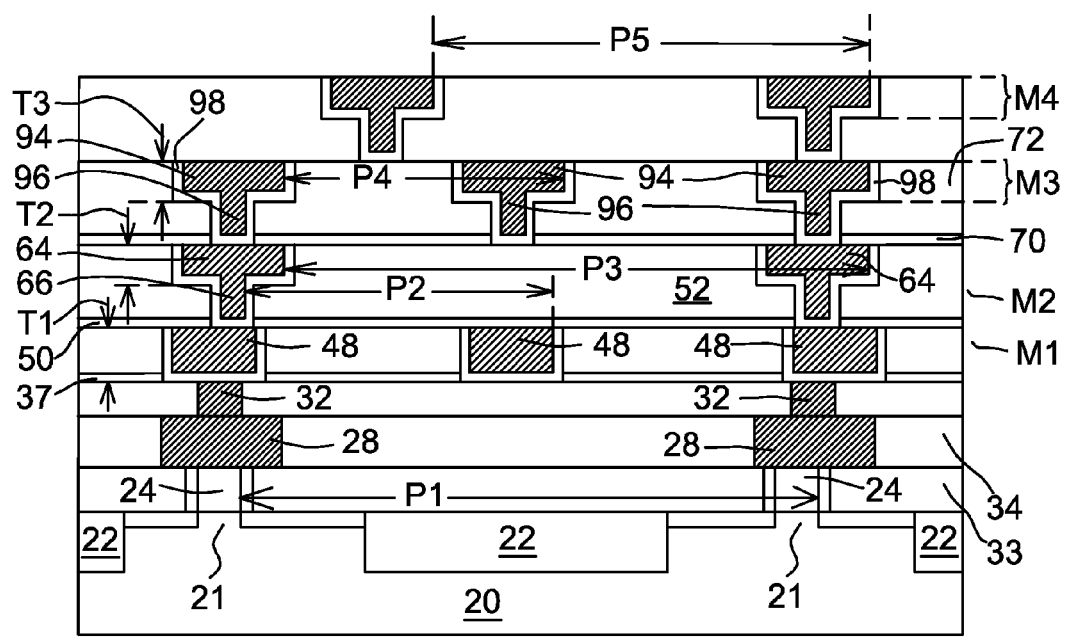

FIGS. 10 through 13 illustrate the 2P2E process for forming metal layer M3 and the underlying vias. Referring to FIG. 10, optional ESL 70 is formed, followed by the formation of IMD 72, which may be a low-k dielectric layer. Hard mask 74, which may be formed of essentially the same material as hard mask 54 in FIG. 5, is formed and patterned. Hard mask 74 includes openings that define the patterns of the metal lines in metal layer M3 (FIG. 13).

Photoresist 76, which may be formed essentially the same material as photoresist 56 (FIG. 6) is formed and patterned to define the patterns of vias. Photoresist 76 is then used to etch into IMD 72 to form openings 78. Openings 78 extend partially into IMD 72, and the bottoms of openings 78 are at an intermediate level of IMD 72. Photoresist 76 is then removed.

FIG. 11 illustrates the formation and the patterning of photoresist 80. Photoresist 80 is patterned using a lithography mask (not shown) different from the lithograph mask (not shown) used in the step shown in FIG. 10, wherein the lithography masks used for the steps shown in FIGS. 10 and 11 may belong to a same double-patterning mask set. Next, IMD 72 is etched to form opening(s) 82, which may stop at a same level as openings 78 (FIG. 10). Photoresist 80 is then removed.

Next, as shown in FIG. 12, hard mask 74 is used to etch into IMD 72, for example, using an anisotropic etching method. During the etching step, openings 78 and 82 extend down so that ESL 70 is exposed. Furthermore, trench openings 84 are formed and stop at an intermediate level of IMD 72. The exposed portions of ESL 70 are etched.

FIG. 13 illustrates the formation of metal lines 94 and vias 96. The formation process may include blanket forming conductive diffusion barrier layer 98, and filling a metallic material such as pure (or substantially pure) copper or a copper alloy into openings 78, 82, and 84. After a CMP process to remove excess metallic material, metal lines 94 and vias 96 are formed, and the formation of metal layer M3 is finished.

It is observed that in FIGS. 10 and 11, two photoresists 76 and 80 are used, and two respective patterning steps are performed on photoresists 76 and 80 and IMD 72. Accordingly, the formation process of metal lines 94 and vias 96 is a 2P2E process. Throughout the description, metal lines 94 and the parts of IMD 72 at the same level as metal lines 94 in combination are referred to as metal layer M3.

Minimum M3 pitch P4 in metal layer M3 may be between about 40 nm and about 80 nm, and may be about 64 nm in an exemplary embodiment. Minimum M3 pitch P4 may be smaller than Minimum M2 pitch P3, with Minimum M2 pitch P3 being equal to about 120 percent and about 150 percent Minimum M3 pitch P4. Furthermore, minimum M3 pitch P4 may be the same (or substantially the same) as minimum M1 pitch P2. Accordingly, the interconnect structure as shown in FIG. 13 is referred to as having a non-hierarchical structure since minimum M3 pitch P4 is smaller than Minimum M2 pitch P3. Thickness T3 of metal layer M3 may be between about 550 Å and about 750 Å, and may be about 650 Å in an embodiment. Thickness T3 may also be equal to, or substantially equal to, thickness T1 of metal layer M1. Furthermore, thickness T2 may be greater than thickness T3, and may be equal to about 120 percent and about 150 percent thickness T3.

In subsequent process steps, upper metal layers M4, M5 (not shown), and up to Mtop (the topmost metal layer, not shown) are formed. The formation process may include 1P1E process and 2P2E process. For metal layers M3 to Mtop, The respective minimum pitches (including minimum M4 pitch P5) may have a hierarchical structure, with the upper metal layers having minimum pitches equal to or greater than the minimum pitches of lower layers.

Metal layers M2 and M3 are formed using dual-damascene structures, in which the metal lines in the metal layers are forming using a same filling and a same CMP process. Accordingly, the dual-damascene metal lines and vias do not have a noticeable interface therebetween. Although metal lines in metal layer M1 is illustrated as being formed using a single damascene process, it may also be formed along with M0 vias 32 using a 2P2E dual-damascene process. The process steps may be similar to what are shown in FIGS. 10 through 13.

Figure 14:
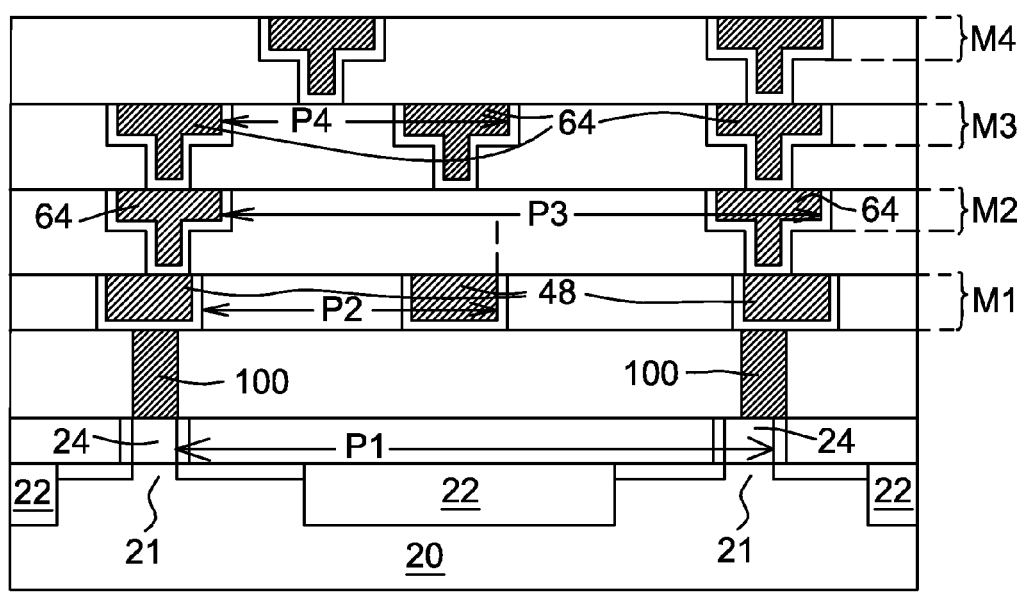
FIG. 14 illustrates the cross-sectional view of an interconnect structure in accordance with various alternative embodiments.

FIG. 14 illustrates an alternative embodiment. This embodiment is essentially the same as in FIG. 13, except contact plugs 100 (which may be formed of tungsten, for example) replace M0 metal lines 28 and M0 vias 32 as in FIG. 13. Unless specified otherwise, the reference numerals in the embodiment shown in FIG. 14 represent like elements in the embodiment illustrated in FIG. 13. The process steps of for forming metal layers M1, M2, and M3 as in FIG. 14 are essentially the same as shown in FIGS. 1 through 13.

In the embodiments, by forming metal layer M2 having a greater minimum pitch and a greater thickness than the minimum pitch and the thickness, respectively, of metal layer M3, the metal lines in metal layer M2 may have reduced resistance, and hence the resulting integrated circuit has improved performance. It is found that the increase in the minimum pitch and the thickness of M2 does not incur any chip area penalty. Furthermore, the increase in the minimum pitch of metal layer M2 makes it possible to use 1P1E process, instead of 2P2E process, for forming metal layer M2. Accordingly, the manufacturing cost is reduced, and manufacturing yield is improved.

In accordance with embodiments, an integrated circuit structure includes a semiconductor substrate, and a first metal layer over the semiconductor substrate. The first metal layer has a first minimum pitch. A second metal layer is over the first metal layer. The second metal layer has a second minimum pitch smaller than the first minimum pitch.

In accordance with other embodiments, an integrated circuit structure includes a semiconductor substrate, and a first metal layer over the semiconductor substrate. The first metal layer has a first thickness. A second metal layer is over the first metal layer. The second metal layer has a second thickness smaller than the first thickness.

In accordance with yet other embodiments, a method includes forming a first metal layer and forming a second metal layer. The step of forming the first metal layer includes forming a first dielectric layer over a semiconductor substrate; forming first openings in the first dielectric layer, wherein all openings in the first dielectric layer are formed using a 1P1E process; and filling a first metallic material in the first openings to form first metal lines. The step of forming the second metal layer includes forming a second dielectric layer over the first metal layer; forming second openings in the second dielectric layer, wherein two neighboring openings in the second dielectric layer are formed using a 2P2E process; and filling a second metallic material in the second openings to form second metal lines.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a semiconductor substrate;
   a first metal layer over the semiconductor substrate, wherein the first metal layer comprises first metal lines therein, and wherein the first metal layer has a first minimum pitch, with the first minimum pitch measured in a first horizontal direction perpendicular to lengthwise directions of first two metal lines that have the first minimum pitch;
   a second metal layer over the first metal layer, wherein the second metal layer comprises second metal lines therein, and wherein the second metal layer has a second minimum pitch smaller than the first minimum pitch, with the second minimum pitch measured in a second horizontal direction perpendicular to lengthwise directions of second two metal lines that have the second minimum pitch; and
   metal vias between the first metal layer and the second metal layer.

2. The integrated circuit structure of claim 1 further comprising:
   a third metal layer under the first metal layer; and
   gate electrodes over the semiconductor substrate and under the third metal layer, wherein at least some of gate electrodes form parts of transistors, and wherein the third metal layer has a third minimum pitch smaller than the first minimum pitch, and smaller than a fourth minimum pitch of the gate electrodes, with the third minimum pitch measured in a third horizontal direction perpendicular to lengthwise directions of third two metal lines that have the third minimum pitch, and the fourth minimum pitch measured in a fourth horizontal direction perpendicular to lengthwise directions of two gate electrodes that have the fourth minimum pitch.

3. The integrated circuit structure of claim 2, wherein the first minimum pitch is substantially equal to the fourth minimum pitch.

4. The integrated circuit structure of claim 1, wherein a first thickness of the first metal layer is greater than a second thickness of the second metal layer.

5. The integrated circuit structure of claim 4, wherein the first thickness is between about 120 percent and about 150 percent the second thickness.

6. The integrated circuit structure of claim 1, wherein the first and the second metal layers comprise metal lines comprising copper, and wherein the metal lines in the first and the second metal layers and respective underlying vias have dual-damascene structures.

7. The integrated circuit structure of claim 1, wherein the first minimum pitch is between about 80 nm and about 100 nm, and the second minimum pitch is between about 40 nm and about 80 nm.

8. The integrated circuit structure of claim 1 further comprising:
   a diffusion barrier layer comprising:
      bottom portions underlying and in physical contact with bottom surfaces of the metal vias, wherein the bottom portions have top surfaces contacting bottom surfaces of the metal vias, and bottom surfaces contacting top surface of the first metal lines; and
      sidewall portions contacting sidewalls of the metal vias.

9. The integrated circuit structure of claim 1, wherein the first minimum pitch is the smallest pitch of all metal lines in the first metal layer, and the second minimum pitch is the smallest pitch of all metal lines in the second metal layer.

10. The integrated circuit structure of claim 2, wherein the third metal layer is immediately over the gate electrodes, with no additional metal layer disposed between the gate electrodes and the third metal layer, and wherein the first metal layer is immediately over the third metal layer, with no additional metal layer disposed between the first metal layer and the third metal layer.

11. An integrated circuit structure comprising:
   a semiconductor substrate;
   a first metal layer over the semiconductor substrate, wherein the first metal layer comprises first metal lines therein, wherein the first metal layer has a first minimum pitch, and wherein the first metal layer has a first thickness;
   a second metal layer over the first metal layer, wherein the second metal layer comprises second metal lines therein, and wherein the second metal layer has a second thickness smaller than the first thickness, and the second metal layer has a second minimum pitch smaller than the first minimum pitch;
   a third metal layer under the first metal layer;
   gate electrodes over the semiconductor substrate and under the third metal layer, wherein at least some of the gate electrodes form parts of transistors, and wherein the third metal layer has a third thickness smaller than the first thickness; and
   metal vias between the first metal layer and the second metal layer.

12. The integrated circuit structure of claim 11, wherein the first minimum pitch is substantially equal to a fourth minimum pitch of the gate electrodes.

13. The integrated circuit structure of claim 11, wherein the first thickness is between about 120 percent and about 150 percent the second thickness.

14. The integrated circuit structure of claim 11, wherein the first and the second metal layers comprise metal lines comprising copper, and wherein the metal lines in the first and the second metal layers and respective underlying vias have dual-damascene structures.

15. The integrated circuit structure of claim 11, wherein the first thickness is between about 800 Å and about 1,200 Å, and the second thickness is between about 550 Å and about 750 Å.

16. The integrated circuit structure of claim 11 further comprising:
   a diffusion barrier layer comprising:
      bottom portions underlying and in physical contact with bottom surfaces of the metal vias, wherein the bottom portions have top surfaces contacting bottom surfaces of the metal vias, and bottom surfaces contacting top surface of the first metal lines; and
      sidewall portions contacting sidewalls of the metal vias.

17. The integrated circuit structure of claim 11, wherein the first minimum pitch is the smallest pitch of all metal lines in the first metal layer, and the second minimum pitch is the smallest pitch of all metal lines in the second metal layer.

18. An integrated circuit structure comprising:
   a semiconductor substrate;
   a first metal layer over the semiconductor substrate, wherein the first metal layer comprises first metal lines therein, and wherein the first metal layer has a first minimum pitch;
   a second metal layer over the first metal layer, wherein the second metal layer comprises second metal lines therein, and wherein the second metal layer has a second minimum pitch smaller than the first minimum pitch;
   a third metal layer under the first metal layer, wherein the third metal layer has a third minimum pitch smaller than the first minimum pitch;
   gate electrodes over the semiconductor substrate and under the third metal layer, wherein at least some of the gate electrodes form parts of transistors, wherein the gate electrodes have a fourth minimum pitch greater than the third minimum pitch, and wherein the fourth minimum pitch is substantially equal to the fourth minimum pitch; and
   metal vias between the first metal layer and the second metal layer.

19. The integrated circuit structure of claim 18, wherein a first thickness of the first metal layer is greater than a second thickness of the second metal layer.

20. The integrated circuit structure of claim 18, wherein the first and the second metal layers comprise metal lines comprising copper, and wherein the metal lines in the first and the second metal layers and respective underlying vias have dual-damascene structures.

* * * * *